United States Patent
Ritter et al.

(10) Patent No.: US 10,192,952 B2
(45) Date of Patent: Jan. 29, 2019

(54) MULTI-LAYER ELECTRONIC DEVICE

(71) Applicant: AVX Corporation, Fountain Inn, SC (US)

(72) Inventors: Andrew P. Ritter, Simpsonville, SC (US); Marianne Berolini, Greenville, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 15/450,063

(22) Filed: Mar. 6, 2017

(65) Prior Publication Data

US 2017/0256604 A1 Sep. 7, 2017

Related U.S. Application Data

(60) Provisional application No. 62/304,583, filed on Mar. 7, 2016.

(51) Int. Cl.
*H01L 49/02* (2006.01)
(52) U.S. Cl.
CPC .................................. *H01L 28/60* (2013.01)
(58) Field of Classification Search
CPC ......... H01G 4/005; H01G 4/232; H01L 28/60
See application file for complete search history.

(56) References Cited

U.S. PATENT DOCUMENTS

| | | |
|---|---|---|
| 3,670,222 A | 6/1972 | Nakata et al. |
| 4,124,876 A | 11/1978 | Labadie et al. |
| 4,661,884 A | 4/1987 | Seaman |
| 4,827,323 A | 5/1989 | Tigelaar et al. |
| 5,204,546 A | 4/1993 | Moulding |
| 5,355,277 A | 10/1994 | Hoshiba |
| 5,367,437 A | 11/1994 | Anderson |
| 5,576,926 A | 11/1996 | Monsorno |
| 5,687,056 A | 11/1997 | Harshe et al. |
| 5,777,839 A | 7/1998 | Sameshima et al. |
| 5,973,907 A | 10/1999 | Reed |

(Continued)

FOREIGN PATENT DOCUMENTS

JP  2009021512  *  1/2009

OTHER PUBLICATIONS

Abstract of Japanese Patent—JP2001217137, dated Aug. 10, 2001, 2 pages.

(Continued)

*Primary Examiner* — Michael Carter
(74) *Attorney, Agent, or Firm* — Dority & Manning, P.A.

(57) ABSTRACT

A multi-layer electronic device is disclosed that comprises a ceramic layer, a first electrode layer, and a second electrode layer. The first electrode layer contains a first tab portion extending to the first lateral edge of the ceramic layer, the first electrode layer further defining a first cut-out region. The second electrode layer contains a second tab portion extending to the first lateral edge of the ceramic layer, the second electrode layer further defining a second cut-out region. The first tab portion of the first electrode layer is offset from the second tab portion of the second electrode layer in the longitudinal direction so that a first gap region is formed within which the first tab portion does not overlap the second tab portion. Further, the first cut-out region at least partially overlaps the second cut-out region.

19 Claims, 6 Drawing Sheets

(56) References Cited

U.S. PATENT DOCUMENTS

| | | | |
|---|---|---|---|
| 6,077,715 | A | 6/2000 | Chivukula et al. |
| 6,212,060 | B1 | 4/2001 | Liu |
| 6,337,791 | B1 | 1/2002 | Monsorno |
| 6,487,064 | B1 | 11/2002 | Monsorno |
| 6,587,327 | B1 | 7/2003 | Devoe et al. |
| 6,816,356 | B2 | 11/2004 | Devoe et al. |
| 6,970,341 | B1 | 11/2005 | Devoe et al. |
| 7,046,500 | B2 * | 5/2006 | Lee ............ H01G 4/012 361/303 |
| 7,075,776 | B1 | 7/2006 | Devoe et al. |
| 7,133,275 | B2 | 11/2006 | Purple et al. |
| 7,307,829 | B1 | 12/2007 | Devoe et al. |
| 7,408,763 | B2 | 8/2008 | Roy |
| 7,641,933 | B2 | 1/2010 | Purple et al. |
| 8,446,705 | B2 | 5/2013 | Ritter et al. |
| 2007/0019363 | A1 * | 1/2007 | Roy ............ H01G 4/012 361/303 |

OTHER PUBLICATIONS

Abstract of Japanese Patent—JP2009021512, dated Jan. 29, 2009, 1 page.
Abstract of Japanese Patent—JP2009176829, dated Aug. 6, 2009, 1 page.
Abstract of Korean Patent—KR20120122380, dated Nov. 7, 2012, 1 page.
Search Report and Written Opinion for PCT/US2017/020869 dated May 15, 2017, 11 pages.

* cited by examiner

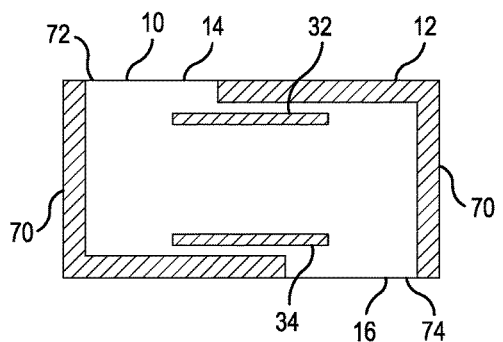
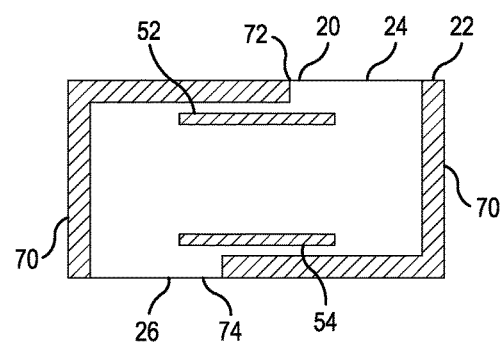
FIG. 1A  FIG. 1B
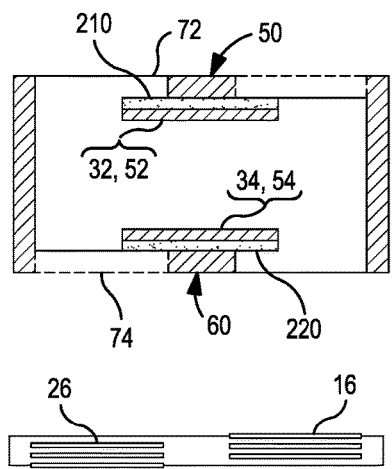
FIG. 2A
FIG. 2B
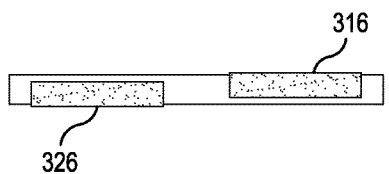
FIG. 3A

MULTI-LAYER ELECTRONIC DEVICE

RELATED APPLICATIONS

The present application claims priority to U.S. Provisional Patent Application No. 62/304,583 (filed on Mar. 7, 2016), which is incorporated herein by reference for all relevant purposes.

BACKGROUND OF THE INVENTION

Capacitors are a fundamental component used for filtering, decoupling, bypassing, and other aspects of such modern applications, which may include such as wireless communications, alarm systems, radar systems, circuit switching, matching networks, and many others. The wide variety of capacitor environments necessitates that capacitors are often subjected to a number of different operating frequencies. Capacitor technology that can accommodate applications at conventional frequency levels as well as increasing higher frequency applications such as related to wireless communications systems, including satellite, GPS, and cellular applications, must exhibit reliable performance characteristics over a generally wide frequency range. In the past, multiple devices (e.g., multi-layer capacitor and single layer capacitor) were employed in tandem to achieve the desired performance over a broad spectrum of operating frequencies. Due to the complexity and costs of such designs, however, a need currently exists for an integrated device that is capable of achieving a similar performance.

SUMMARY OF THE INVENTION

In accordance with one embodiment of the present invention, a multi-layer electronic device is disclosed that comprises a ceramic layer that extends in a longitudinal direction between first and second longitudinal edges and in a lateral direction between first and second lateral edges, wherein a longitudinal centerline is defined between the first and second longitudinal edges and a lateral centerline is defined between the first and second lateral edges. The device comprises a first electrode layer disposed vertically over the ceramic layer, wherein the first electrode layer contains a first tab portion extending to the first lateral edge of the ceramic layer, the first electrode layer further defining a first cut-out region. The device also comprises a second electrode layer disposed vertically beneath the ceramic layer, wherein the second electrode layer contains a second tab portion extending to the first lateral edge of the ceramic layer, the second electrode layer further defining a second cut-out region. The first tab portion of the first electrode layer is offset from the second tab portion of the second electrode layer in the longitudinal direction so that a first gap region is formed within which the first tab portion does not overlap the second tab portion. Further, the first cut-out region at least partially overlaps the second cut-out region.

Other features and aspects of the present invention are set forth in greater detail below.

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which:

FIGS. 1A and 1B illustrate respective views of first and second electrode layers of an exemplary multi-layer component in accordance with aspects of the present subject matter;

FIG. 2A illustrates a pre-metallization plan view of an exemplary multi-layer component produced by stacking multiple first and second electrode layers as illustrated in FIGS. 1A and 1B;

FIG. 2B illustrates an exemplary pre-metallization side view of the stacked multiple electrode layers;

FIG. 3A illustrates an exemplary side view of the stacked multi-layer electrodes following metallization of the top, bottom, and side surfaces of the assembly illustrated in FIG. 2A;

Figure 3B:
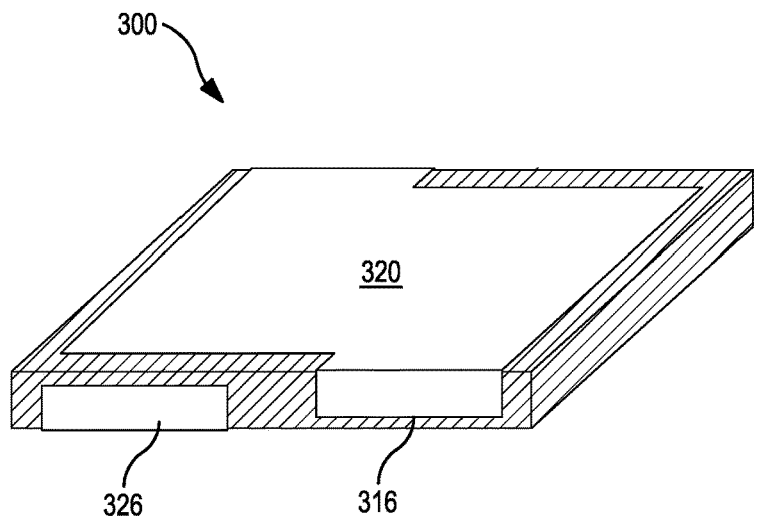
FIGS. 3B and 3C illustrate respective top and bottom perspective views of the metallized assembly in accordance with aspects of a multi-layer component of the present subject matter.

Repeat use of the reference characters throughout the present specification and appended drawings is intended to represent same or analogous features, steps, or other elements of the present technology.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to an integrated multi-layer electronic device (e.g., capacitor, varistor, etc.) that is capable of achieving good electrical performance over a broad spectrum of operating frequencies. The device contains a ceramic layer interposed between alternating first and second electrode layers. The first electrode layer may contain a first tab portion extending to a first lateral edge of the ceramic layer and the second electrode layer contains a second tab portion also extending to the first lateral edge of the ceramic layer. The first and second tab portions of each respective electrode layer are offset from each other in a longitudinal direction. For example, the tab portions may be symmetrically offset a certain distance from a longitudinal centerline of the ceramic layer. Regardless, a gap region is formed between the first and second portions within which the first and second electrodes do not overlap in the vertical direction. If desired, additional tab portions may also be employed. For example, the first electrode layer may also contain a third tab portion extending to a second lateral edge of the ceramic layer that is opposite to the first lateral edge, and the second electrode layer may contain a fourth portion also extending to the second lateral edge of the ceramic layer. The third and fourth tab portions of each respective electrode layer may be offset from each other, such as symmetrically offset, so that another gap region is formed between the third and fourth tab portions within which the first and second electrode layers do not overlap in the vertical direction.

In addition, the first electrode layer defines a first cut-out region and the second electrode layer defines a second cut-out region. The first and second cut-out regions are positioned so that when the electrodes are arranged in a vertical orientation, the first cut-out region at least partially overlaps (e.g., superimposed over) the second cut-out region. If desired, the first electrode layer may also define a third cut-out region and the second electrode layer may define a fourth cut-out region. In such embodiments, the first cut-out region and third cut-out region may be spaced generally symmetrically about the longitudinal and/or lateral centerline of the ceramic layer, and the second cut-out region and fourth cut-out region may be spaced generally symmetrically about the longitudinal and/or lateral centerlines of the ceramic layer. The third and fourth cut-out regions may likewise be positioned so that when the electrodes are arranged in a vertical orientation, the third cut-out region at least partially overlaps the fourth cut-out region.

Through selective control over the particular nature of the electrode layers (e.g., offset tab portions and cut-out regions), the present inventors have discovered that the resulting device can exhibit improved performance over a wide range of frequencies. For example, during relatively high frequency operation, the cut-out regions can produce current crowding that contributes to the production of a lower value of capacitance by forcing current flow through the electrode area between the cut-out regions and the outer edge of the electrodes, which in turn provides the smaller surface area of the electrode as the primary source of capacitance for the device. On the other hand, during relatively lower frequency operation (e.g., below fundamental resonant frequency of the device), the current crowding effect is lessened and substantially the entire surface area of the electrode layers contributes to the total capacitive value of the device.

Referring now to FIGS. 1-3, for instance, one particular embodiment of a multi-layer electronic device will now be described in more detail. As shown in FIG. 1A and 1B, a first electrode layer 10 may be disposed vertically above a surface of a first ceramic layer 12 (FIG. 1A) and a second electrode layer 20 may be disposed vertically beneath a surface of a second ceramic layer 22 (FIG. 1B). The ceramic layer 12 and/or ceramic layer 22 may extend in a longitudinal direction between first and second longitudinal edges 70 and in a lateral direction between first and second lateral edges 72 and 74, respectively, so that a longitudinal centerline is defined between the first and second longitudinal edges 70 and a lateral centerline is defined between the first and second lateral edges 72 and 74. The electrode layers may be formed from any of a variety of different metals as is known in the art, such as precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may be particularly suitable for use in the present invention.

The ceramic layers 12 and 22 may be provided in a variety of forms, such as a wafer (e.g., pre-fired) or a dielectric material that is co-fired within the device itself. Regardless, the ceramic layers 12 and 22 are typically formed from a material having a relatively high dielectric constant (K), such as from about 10 to about 40,000 in some embodiments from about 50 to about 30,000, and in some embodiments, from about 100 to about 20,000. Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable pervoskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5$ $KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1).

Referring again to FIGS. 1A and 1B, the first electrode layer 10 also contains a first tab portion 14 extending to the first lateral edge 72 of the ceramic layer 12 and the second electrode layer 20 contains a second tab portion 24 extending to the first lateral edge 72 of the ceramic layer 22. As indicated above, the first and second tab portions of each respective electrode layer are offset from each other. For example, in the illustrated embodiment, the first tab portion 14 and the second tab portion 24 are symmetrically offset a certain distance from a longitudinal centerline of the ceramic layer so that they form a "mirror" image of each other. Although not necessarily required, the first electrode layer 10 also contains a third tab portion 16 extending to the second lateral edge 74 of the ceramic layer 12, which is opposite to the first lateral edge 72, and the second electrode layer 20 contains a fourth tab portion 26 extending to the second lateral edge 74 of the ceramic layer 22. The third tab portion 16 may be symmetrically offset from the first tab portion 14 along the lateral and/or longitudinal centerlines of the first electrode layer 10, while the fourth tab portion 26 may likewise be symmetrically offset from the second tab portion 24 along the lateral and/or longitudinal centerlines of the second electrode layer 20. The third tab portion 16 and the fourth tab portion 26 may also be symmetrically offset a certain distance from a longitudinal centerline of the ceramic layer so that they form a "mirror" image of each other.

In addition, the first electrode 10 also defines a first cut-out region 32 and an opposing third cut-out region 34, which as shown, may be symmetrically offset a certain distance from the lateral and/or longitudinal centerlines of the electrode layer 10. Likewise, the second electrode 10 defines a second cut-out region 52 and an opposing fourth cut-out region 54, which as shown, may be symmetrically offset a certain distance from the lateral and/or longitudinal centerlines of the electrode layer 20.

To form the multi-layer electronic device, the first electrode layer 10 is generally arranged in a vertical configuration with the second electrode layer 20 so that the ceramic layer 12 is positioned therebetween. FIG. 2A illustrates a top view of this superimposed structure. As shown, the first tab portion 14 of the first electrode layer 10 and the second tab portion 24 of the second electrode layer 20 extend to the first lateral edge 72 of the ceramic layer 12, and the third tab portion 16 of the first electrode layer 10 and the fourth tab portion 26 of the second electrode layer 20 extend to the second lateral edge 74 of the ceramic layer 12. In this manner, a first gap region 50 is defined between the first tab portion 14 and the second tab portion 24 along the first lateral edge of the ceramic layer 12 within which the first electrode layer 10 and second electrode layer 20 do not overlap. Likewise, a second gap region 60 is defined between the third tab portion 16 and the fourth tab portion 26 along the second lateral edge of the ceramic layer 12 within which the first electrode layer 10 and the second electrode layer 20 do not overlap. The first and second gap regions may be generally symmetrical about the lateral and/or longitudinal centerlines of the electrode layers. Further, when the electrode layers are arranged in a vertical configuration as shown in FIG. 2A, the first cut-out region 32 overlaps the second cut-out region 52 and the third cut-out region 34 at overlaps the fourth cut-out region 54. The overlapping cut-out regions 32, 52 and 34, 54 may be, respectively, symmetrically disposed about the longitudinal and/or lateral centerlines of the electrode layers. With such a configuration, it has been discovered that device capacitance at higher frequencies may stem primarily from the regions between the overlapping cut-out regions and the respective areas proximate the tab portions. Such higher frequency capacitance producing areas corresponds generally to shaded areas labeled as 210 and 22 in FIG. 2A.

In the embodiments discussed above, reference has been made to two primary electrode layers. It should of course be understood that multiple alternating electrode and ceramic layers may be employed in the present invention as is well known in the art of multi-layer electronic devices. In FIG. 2B, for instance, an embodiment is shown that contains four (4) additional alternating electrode layers. In such embodiments, the additional electrode layers may optionally have features (e.g., tab portions and/or cut-out regions) such as discussed above, although such features are by no means required.

Figure 3C:
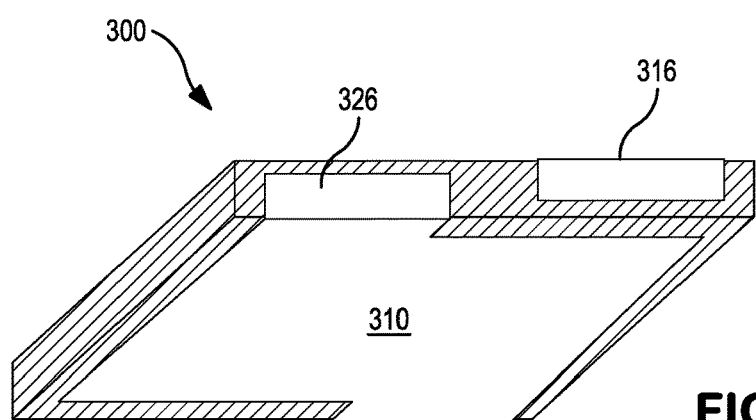

Once the internal electrode layers have been formed, the multi-layer electronic device may be terminated using techniques well known to those skilled in the art, such as sputtering, painting, printing, electroless plating or fine copper termination (FCT), electroplating, plasma deposition, propellant spray/air brushing, and so forth. FIGS. 3A, 3B, and 3C illustrate one embodiment of a terminated device that contains a first external contact 316 in electrical connection with the second electrode layer 10 and a second external contact 326 in electrical connection with the second electrode layer 20. As shown in FIGS. 3B, the first external contact 316 may be present on the top surface and/or one or more opposing edges of the device, while the second external contact 326 may be present on the bottom surface and/or one or more opposing edges of the device. If desired, a masking material (not shown), such as a solder mask, may optionally be employed to cover those portions of the electrodes that are exposed on the edges of the device. In such embodiments, the external contacts will be located primarily on the top and bottom surfaces of the device.

Figure 9A:
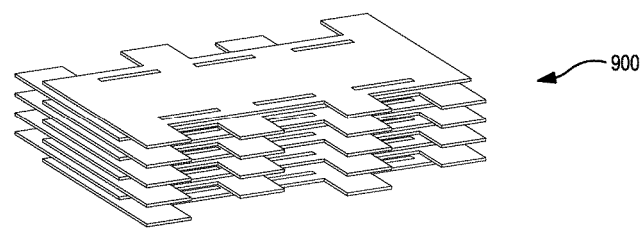
FIG. 9A is a side perspective view of an exemplary further embodiment of the presently disclosed subject matter, configured for broadband application in an interdigitated capacitor (IDC) arrangement.
Figures 9B, 9C:
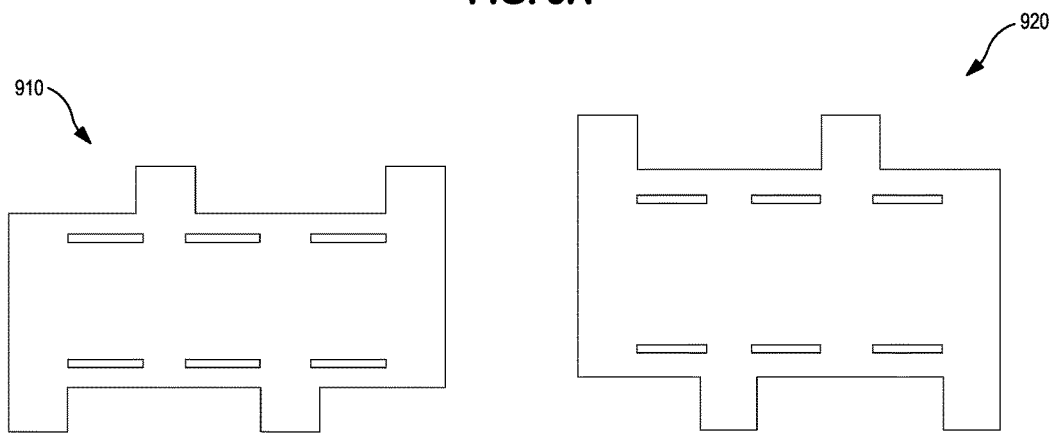
FIGS. 9B and 9C, respectively illustrate top views of exemplary first and second electrode patterns for use in the exemplary embodiment of FIG. 9A.
Figure 10A:
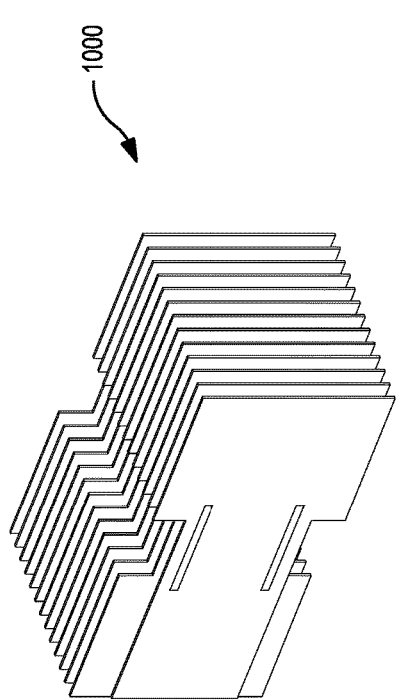
FIG. 10A is a side perspective view of an exemplary further embodiment of the presently disclosed subject matter, configured for broadband application in a land grid array (LGA) arrangement.
Figure 10C:
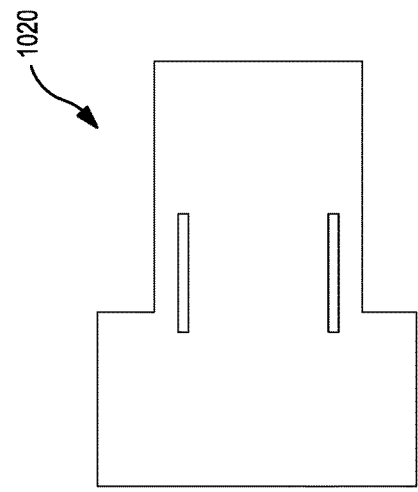
FIGS. 10B and 10C, respectively illustrate top views of exemplary first and second electrode patterns for use in the exemplary embodiment of FIG. 10A.
Figure 10B:
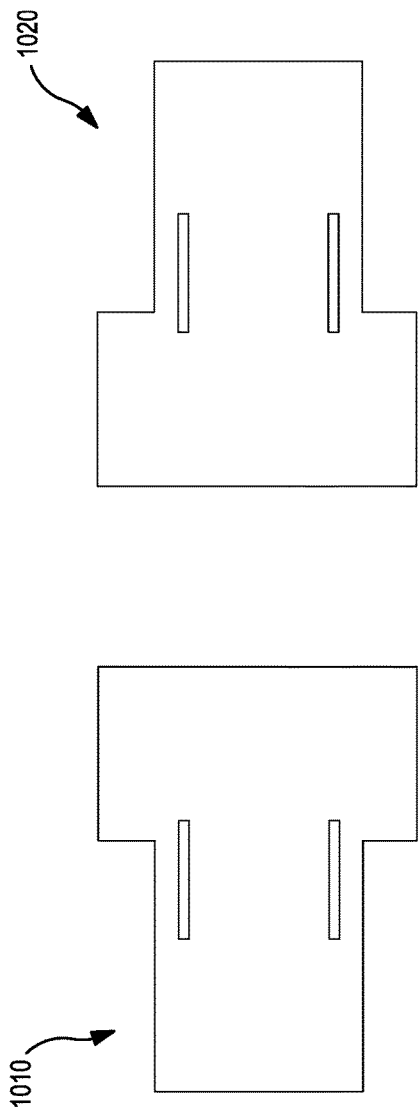

Of course, various other possible configurations of the multi-layer electronic device are contemplated within the scope of the present invention. In certain embodiments, for instance, multiple tab portions may be employed on each electrode layer. One example of such a device is shown in FIGS. 9A-9C as element 900, which includes a plurality of first electrode layers 910 and a plurality of second electrode layers 920, each of which contain offsetting and symmetrical tab portions. In yet another embodiment, the tab portions on a single electrode layer may be disposed symmetrically about one centerline, but not the other centerline. An example of such a device is shown in FIGS. 10A-10C. In this embodiment, for instance, a device 1000 is shown that contains a plurality of first electrode layers 1010 and a plurality of second electrode layers 1020. The first electrode layers contain a first tab portion and third tab portion (FIG. 10B) that are disposed symmetrically about the lateral centerline but not the longitudinal centerline as both tab portions are located along a lateral edge. Similarly, the second electrode layers contain a second tab portion and fourth tab portion (FIG. 10C) that are disposed symmetrically about the lateral centerline but not the longitudinal centerline as both tab portions are located along a lateral edge.

Figure 4:
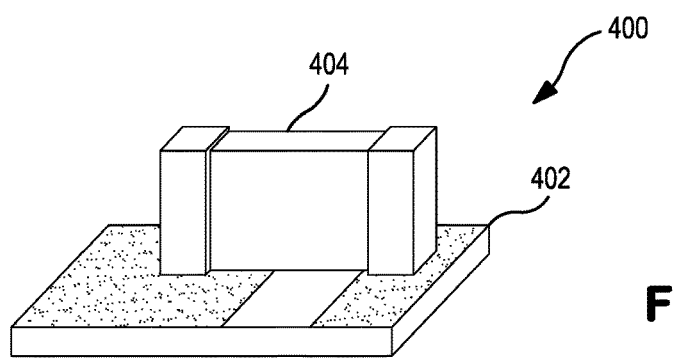
FIG. 4 illustrates a previously known configuration of a pair of stacked capacitors that the present subject matter is designed to replace.
Figure 5:
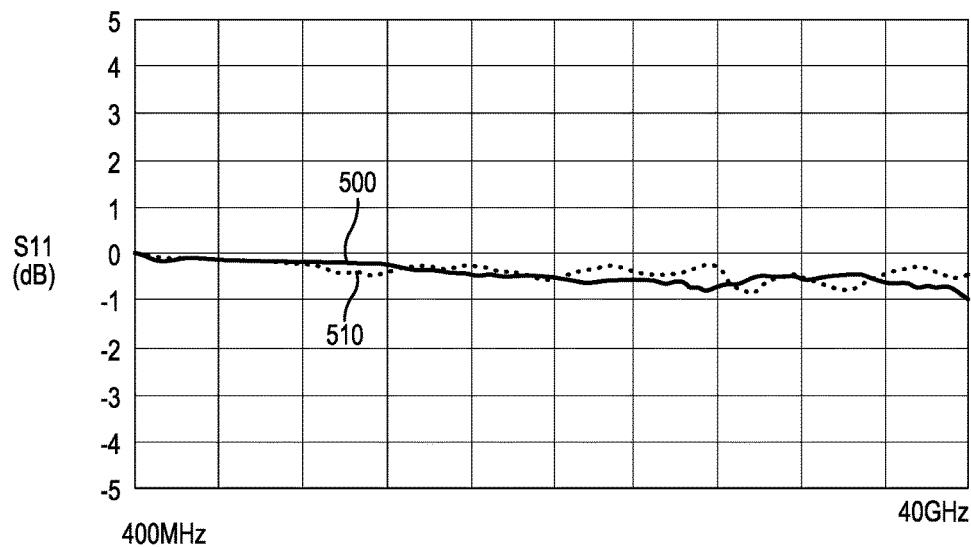
FIG. 5 is a graphical comparison of the return loss between the previously known stacked configuration and a device constructed in accordance with present technology.
Figure 6:
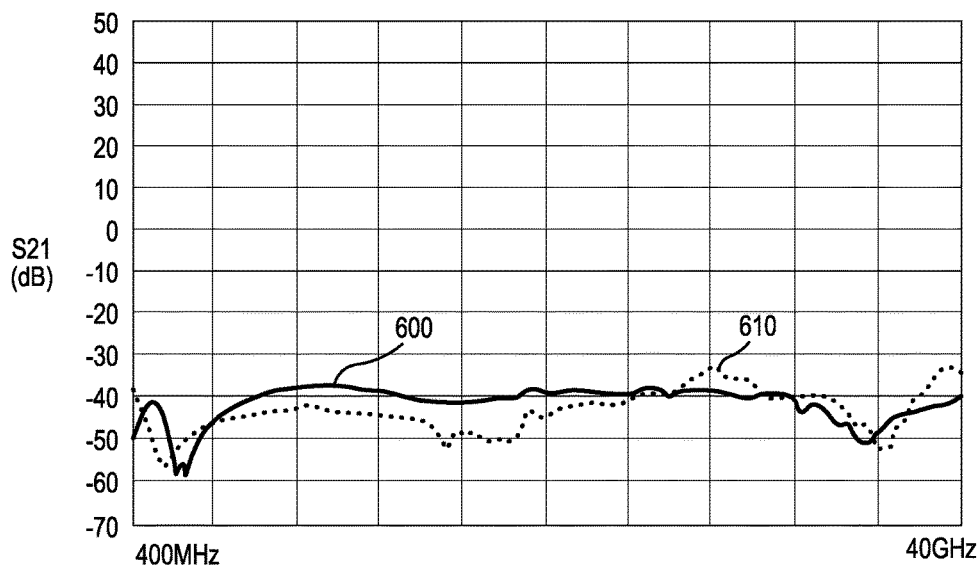
FIG. 6 is a graphical comparison of the insertion loss between the previously known stacked configuration and a device constructed in accordance with present technology.
Figure 7:
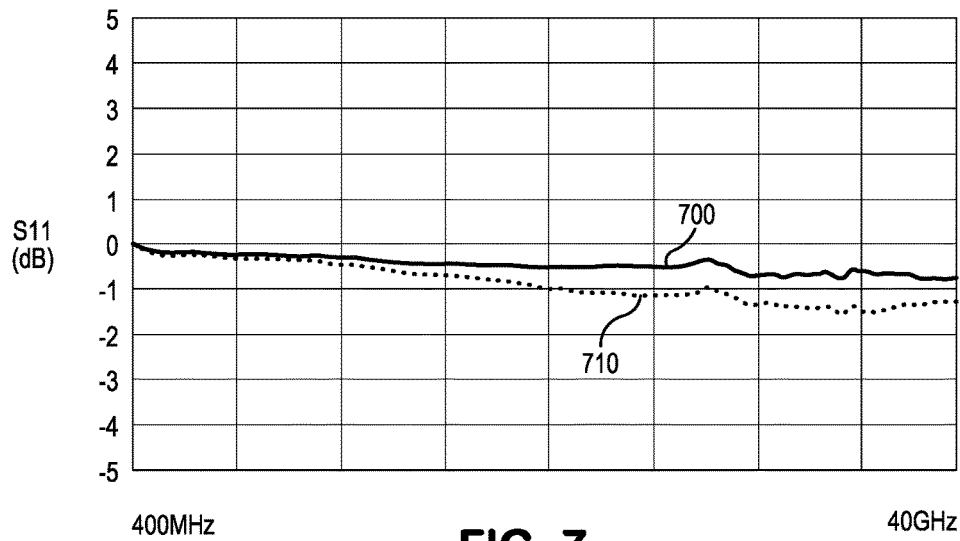
FIG. 7 is a graphical comparison of the return loss between a device similar to that of the present technology but constructed with solid internal electrodes and a device constructed in accordance with present technology including cut-out portions.
Figure 8:
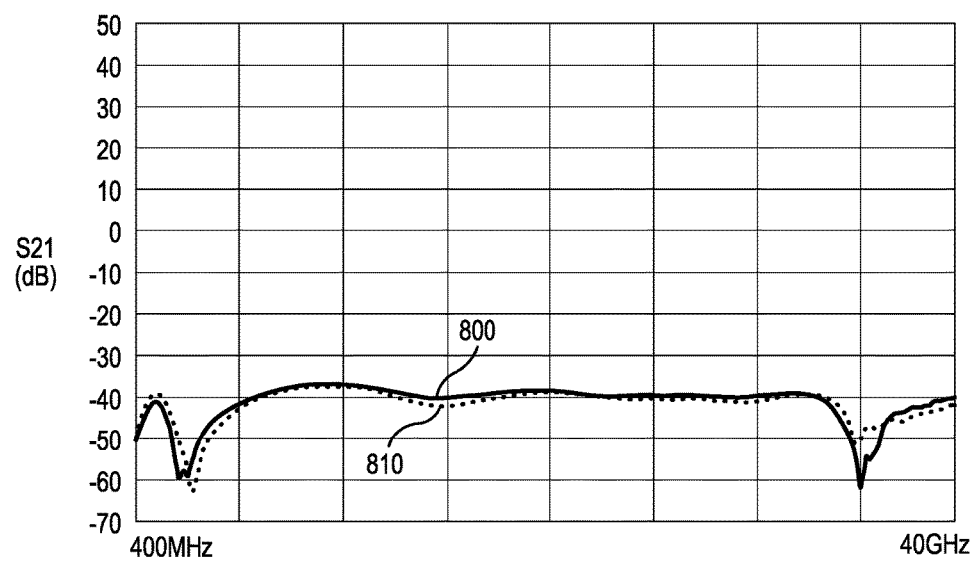
FIG. 8 is a graphical comparison of the insertion loss between a device similar to that of the present technology but constructed with solid internal electrodes and a device constructed in accordance with present technology including cut-out portions.

As a result of the present invention, a multi-layer electronic device (e.g., capacitor) may be formed that exhibits many desirable performance characteristics for certain circuit applications. In certain embodiments, for example, the device may provide a thin, low equivalent series inductance (ESL) component. FIGS. 5-6, for instance, show a graphical comparison of the return loss (FIG. 5) and insertion loss (FIG. 6) between a device 500, 600 constructed in accordance with present technology and a conventional configuration 510, 610. An example of such a conventional device is shown in FIG. 4 as element 400 and contains a multi-layer capacitor 402 (e.g., about 100 nF) and a single layer capacitor 404 (e.g., about 1.8 nF) soldered thereto. As may be seen from the graphs on FIGS. 5-6, however, the integrated design of the present invention can achieved the performance of the conventional multi-layer/single layer soldered component, but also provide an insertion loss of approximately −40 dB up to 40 GHz. FIG. 7-8 likewise illustrate the return loss (FIG. 7) and insertion loss (FIG. 8) for a device 700, 800 with cut-out regions and for a device 710, 810 without cut-out regions. As shown, the device 710 lacking the cut-out regions gives a higher return loss.

While the present subject matter has been described in detail with respect to specific embodiments thereof, it will be appreciated that those skilled in the art, upon attaining an understanding of the foregoing, may readily produce alterations to, variations of, and/or equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A multi-layer electronic device comprising:
   a ceramic layer having first and second longitudinal edges that extend in a lateral direction and having first and second lateral edges that extend in a longitudinal direction;
   a first electrode layer disposed vertically over the ceramic layer, wherein the first electrode layer comprises a first electrode comprising a first tab portion extending to the first lateral edge of the ceramic layer, the first electrode defining a first cut-out region that is contained within a perimeter of the first electrode such that the first cut-out region is not open to any edge of the first electrode layer;
   a second electrode layer disposed vertically beneath the ceramic layer and comprising a second electrode, wherein the second electrode comprises a second tab portion extending to the first lateral edge of the ceramic layer, the second electrode further defining a second cut-out region;
   wherein the first tab portion of the first electrode is offset from the second tab portion of the second electrode in the longitudinal direction so that a first gap region is formed within which the first tab portion does not overlap the second tab portion, wherein the first cut-out region at least partially overlaps the second cut-out region, and further wherein the first cut-out region is elongated in the longitudinal direction with respect to the lateral direction.

2. The device of claim 1, wherein a longitudinal centerline is defined that extends in the lateral direction, and wherein the first tab portion and the second tab portion are disposed symmetrically about the longitudinal centerline of the ceramic layer.

3. The device of claim 1, wherein the first electrode layer further contains a third tab portion extending to the second lateral edge of the ceramic layer.

4. The device of claim 3, wherein the second electrode layer further contains a fourth tab portion extending to the second lateral edge of the ceramic layer.

5. The device of claim 4, wherein the third tab portion of the first electrode layer is offset from the fourth tab portion of the second electrode layer in the longitudinal direction so that a second gap region is formed within which the third tab portion does not overlap the fourth tab portion.

6. The device of claim 5, wherein a lateral centerline is defined that extends in the longitudinal direction and a longitudinal centerline is defined that extends in the lateral direction, and wherein the first gap region and the second gap region are disposed symmetrically about at least one of the longitudinal or lateral centerlines of the ceramic layer.

7. The device of claim 1, wherein a longitudinal centerline is defined that extends in the lateral direction, and wherein the first cut-out region and the second cut-out region are disposed symmetrically about the longitudinal centerline of the ceramic layer.

8. The device of claim 1, wherein a lateral centerline is defined that extends in the longitudinal direction, and wherein the first cut-out region and the second cut-out region are disposed symmetrically about the lateral centerline of the ceramic layer.

9. The device of claim 1, wherein the ceramic layer is in the form of a wafer.

10. The device of claim 1, wherein the ceramic layer contains a dielectric material.

11. The device of claim 1, further comprising a first external contact in electrical connection with the first electrode layer and a second external contact in electrical connection with the second electrode layer.

12. The device of claim 11, wherein the first external contact is present on a top surface and optionally one or more opposing edges of the device, and further wherein the second external contact is present on a bottom surface and optionally one or more opposing edges of the device.

13. The device of claim 11, wherein the first external contact is present only on a top surface of the device and the second external contact is present only on a bottom surface of the device.

14. The device of claim 13, further comprising a masking material that covers portions of the first electrode layer and the second electrode layer that are exposed on edges of the device.

15. The device of claim 1, wherein the device contains a plurality of alternatively ceramic layers, first electrode layers, and second electrode layers.

16. The device of claim 1, wherein the device is a capacitor.

17. The device of claim 1, wherein the first cut-out region has a generally elongated rectangular shape.

18. A multi-layer electronic device comprising:
    a ceramic layer comprising first and second lateral edges that extend in a longitudinal direction;
    a first electrode layer disposed vertically over the ceramic layer, the first electrode layer comprising a first electrode that comprises a first tab portion extending to the first lateral edge of the ceramic layer, the first electrode defining a first cut-out region that is contained within a perimeter of the first electrode such that the first cut-out region is not open to any edge of the first electrode layer;
    a second electrode layer disposed vertically beneath the ceramic layer and comprising a second electrode, wherein the second electrode comprises a second tab portion extending to the first lateral edge of the ceramic layer, the second electrode further defining a second cut-out region;
    wherein the first tab portion of the first electrode is offset from the second tab portion of the second electrode in the longitudinal direction so that a first gap region is formed within which the first tab portion does not overlap the second tab portion, wherein the first cut-out region at least partially overlaps the second cut-out region, and further wherein the first cut-out region is elongated along a length that extends generally parallel with the first and second lateral edges to form a high frequency capacitance region of the first electrode between the first cut-out region and an edge of the first electrode.

19. A multi-layer electronic device comprising:
a ceramic layer comprising first and second lateral edges that extend in a longitudinal direction;
a first electrode layer disposed vertically over the ceramic layer, the first electrode layer comprising a first electrode comprising a first tab portion extending to the first lateral edge of the ceramic layer, the first electrode defining a first cut-out region that is contained within a perimeter of the first electrode such that the first cut-out region is not open to any edge of the first electrode layer;
a second electrode layer disposed vertically beneath the ceramic layer, wherein the second electrode layer comprises a second electrode that contains a second tab portion extending to the first lateral edge of the ceramic layer, the second electrode defining a second cut-out region;
wherein the first tab portion of the first electrode is offset from the second tab portion of the second electrode in the longitudinal direction so that a first gap region is formed within which the first tab portion does not overlap the second tab portion, wherein the first cut-out region at least partially overlaps the second cut-out region, and wherein the first cut-out region has a length in the longitudinal direction that at least partially overlaps the first tab portion in the longitudinal direction.

* * * * *